United States Patent [19]

Nagaishi

[11] Patent Number: 5,099,212
[45] Date of Patent: Mar. 24, 1992

[54] GROUND SENSING INDICATOR AND OUTLET STRIP

[75] Inventor: Yoshi M. Nagaishi, Unionville, Canada

[73] Assignee: Noma Inc., Scarborough, Canada

[21] Appl. No.: 428,136

[22] Filed: Oct. 27, 1989

[51] Int. Cl.⁵ .................................... G01R 31/14
[52] U.S. Cl. ........................ 324/508; 324/133; 324/509; 340/656
[58] Field of Search ............... 324/508, 509, 133; 340/650, 651, 656

[56] References Cited

U.S. PATENT DOCUMENTS

| | | | |
|---|---|---|---|
| 3,810,003 | 5/1974 | Portoulas | 324/508 |
| 3,898,557 | 8/1975 | Strock | 324/508 |
| 3,922,659 | 11/1975 | Dighe | 340/651 |
| 3,924,914 | 12/1975 | Banner | 340/656 |
| 4,082,995 | 4/1978 | Rhude | 324/508 |
| 4,164,701 | 8/1979 | Gulledge et al. | 324/508 |
| 4,164,702 | 8/1979 | Pereda | 324/508 |
| 4,292,585 | 9/1981 | Charette | 324/508 |
| 4,829,289 | 5/1989 | Kallman et al. | 340/656 |
| 4,929,887 | 5/1990 | Robitaille et al. | 324/133 |

FOREIGN PATENT DOCUMENTS

| | | | |
|---|---|---|---|
| 2633786 | 2/1978 | Fed. Rep. of Germany | 324/508 |
| 2421390 | 10/1979 | France | 324/508 |

*Primary Examiner*—Kenneth A. Wieder
*Assistant Examiner*—Maura K. Regan
*Attorney, Agent, or Firm*—Kenneth M. Garrett

[57] ABSTRACT

A ground circuit indicator has a very high resistance and low leakage current to ground. Accordingly, should the ground circuit not be connected, the voltage applied to the chassis of any appliance connected to the circuit will be low, and will not expose persons to a shock hazard. The indicator is adapted for use with multiple outlet connectors.

3 Claims, 1 Drawing Sheet

GROUND SENSING INDICATOR AND OUTLET STRIP

FIELD OF INVENTION

This invention relates to electrical apparatus. It particularly relates to simple means for detecting and indicating the presence of a ground circuit.

BACKGROUND OF INVENTION

The safe operation of much electrical equipment is dependent upon the equipment being grounded.

The reliability of operation of equipment may also be effected where the ground circuit is defective. Thus in a typical computer set-up, power connection of the computer and peripherals is commonly made through a multiple outlet adaptor, and transients generated in one peripheral may adversely affect the operation of other parts of the equipment unless filtered and grounded out.

It is known to include an LED indicator in a circuit between Line and Ground. Where the Ground is defective the LED will not be illuminated. Such circuit normally comprises an LED and a current limiting resistance in series. Where the Ground is defective a significant voltage will be sensed on all grounded portions of the multiple outlet adaptor and the equipment connected to it. Although this is unlikely to be life threatening, it can give an unpleasant shock.

In is an object of the invention to provide an improved ground sensing and indicating circuit.

It is a further object of the invention to provide multiple outlet connectors incorporating the improved ground sensing and indicating circuit.

SUMMARY OF INVENTION

In accordance with one aspect of the invention, a ground sensing indicator for sensing and indicating the state of a Ground connector of a three wire outlet including a Line connector and a Neutral connector, comprises a first high resistance circuit means connected between the Ground and Neutral connectors for comparing the voltage therebetween, and second circuit means including an LED connected between the line and Neutral connectors, the first circuit means enabling the second circuit means upon detection of a voltage at the Ground connector more negative than the voltage at the Neutral connector.

By high resistance it is intended to mean a resistance having a value not less than about one megohm, and preferably not less than about ten megohms.

In accordance with preferred aspects of the invention, the first circuit means includes a first transistor having the base thereof connected to said Ground connector by resistance to several megohms. The first transistor is biased OFF when the voltage at the Neutral connector is more negative than that at the Ground connector, which situation will arise if the Ground connector is improperly grounded. When grounded, the voltage at the Ground connector will be more negative by a small amount than the voltage at the Neutral connector, and accordingly the first transistor will be biased ON.

The second circuit means includes a second transistor which is connected to be switched ON only for so long as the first transistor is switched ON.

It will be appreciated that the very high resistance of the first circuit means is such as to limit the voltage at the Ground connector in the event that this is not connected to a ground.

These foregoing objects and aspects of the invention, together with other objects, aspects and advantages thereof will be more apparent from the following description of a preferred embodiment thereof, taken in conjunction with the following drawings.

DESCRIPTION OF THE PREFERRED EMBODIMENT

Figure 1:
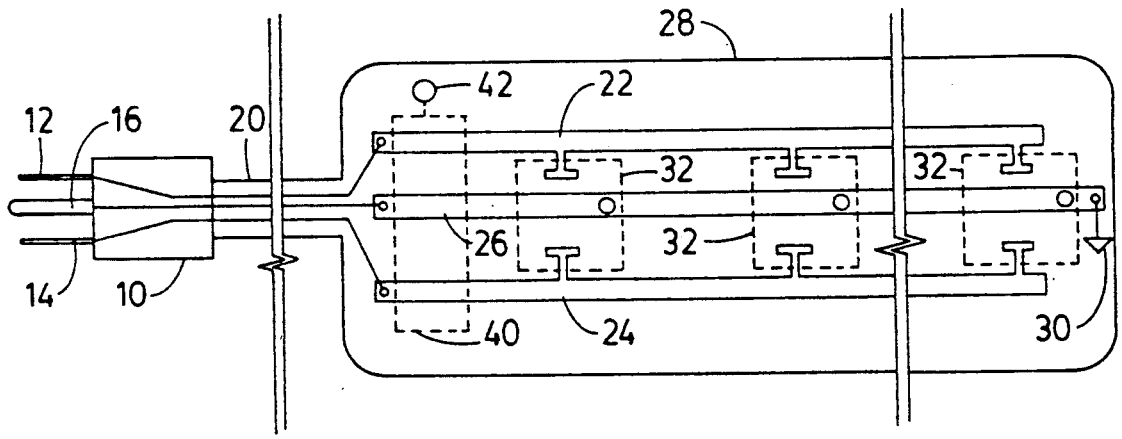
FIG. 1 shows in diagrammatic plan form a power bar incorporating the improved ground sensing indicator circuit.

Considering the drawings in detail, a multiple outlet adaptor of the type known as a power bar comprises a plug 10 having three prongs 12, 14, 16 respectively disposed for connection to the Line connector, Neutral connector and Ground connector of a convenience outlet (not shown). Prongs 12, 14, 16 connect through the conductors of extension cord 20 to a line bus 22, Neutral bus 24 and Ground bus 26 contained in a housing 28, metallic portions of which are connected to the Ground bus at chassis connector 30. A plurality of convenience outlets 32 are connected in parallel to buses 22, 24, 26.

A groung sensing indicator 40 including an LED 42 is connected to buses 22, 24, 26. Ground sensing indicator 40 includes a first circuit connected between the Neutral bus 24 and Ground bus 26, comprising a first transistor 44 switchable between conductive and non-conductive states. Transistor 44 has a base 46 connected to the Ground bus by means of a resistance having a value of several megohms, the collector 50 of which connects to Neutral bus 24 by resistance 52.

Ground sensing indicator 40 includes a second circuit connected between the Line bus 22 and Neutral bus 24, comprising diode 60, resistance 62, transistor switch 64 and LED 42. The base 66 of transistor 64 connects directly to the collector 50 of transistor 44.

When Ground bus 22 is properly grounded and the Line and Neutral buses 22, 24 connected to a supply vlotage, the Ground bus will be slightly more negative than the Neutral bus and accordingly there will be a current flow in a direction to bias transistor 44 ON, thereby increasing the voltage at collector 50, and at base 66 of transistor 64 to bias this into a conducting state, so firing LED 42, through diode 60 and current limiting resistance 62.

When Ground bus 26 is not properly grounded and the Line and Neutral buses 22, 24 are connected to a supply voltage, the Ground bus will be slightly more positive than the Neutral bus, and transistor 44 will accordingly be turned or held OFF. In this condition the voltage at base 66 of transistor 64 is below a value sufficient to turn transistor 64 ON, or to maintain it ON, whereby LED 42 is held OFF.

Figure 2:
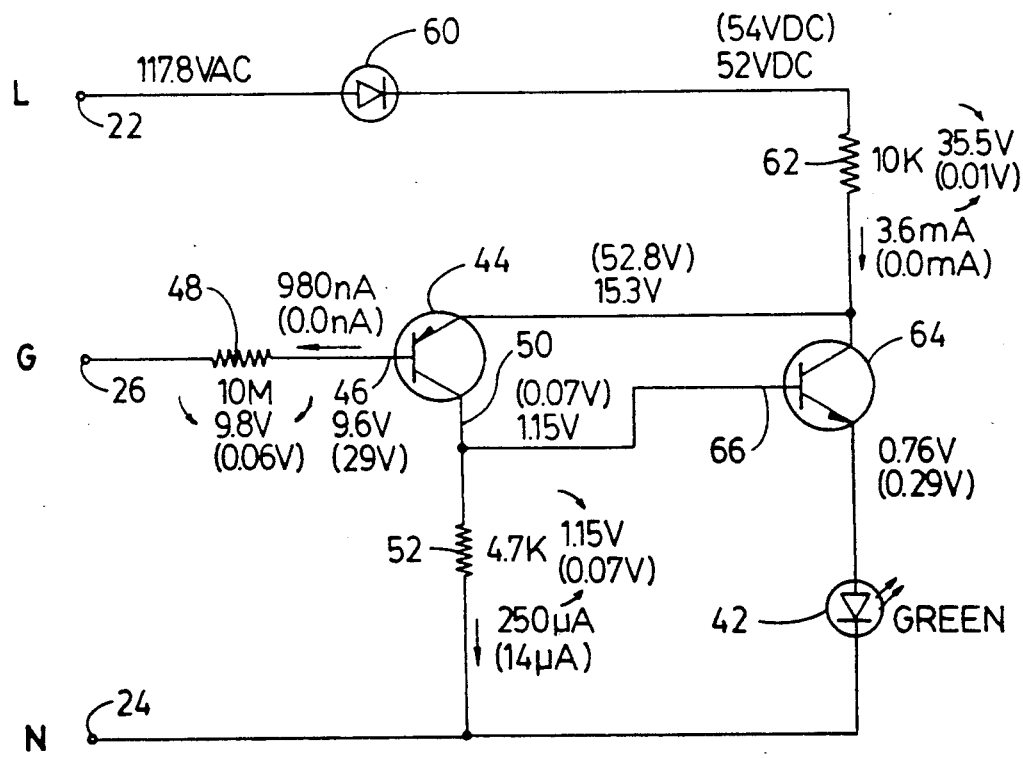
FIG. 2 shows an improved ground sensing indicator circuit in accordance with the invention.

Typical operating voltage and currents are indicated in FIG. 2, those in parenthesis being with the ground removed.

It will be apparent that many changes may be made to the illustrative embodiment, while falling within the scope of the invention and it is intended that all such changes be covered by the claims appended hereto.

I claim:

1. In a ground sensing indicator for continuously sensing and indicating the state of a ground connector of a three wire outlet comprising:
   said ground connector;
   line connector;
   a neutral connector;
   first high resistance circuit means connected between said ground and neutral connectors for comparing the voltage therebetween; and
   second circuit means including an LED connected between said line and neutral connectors,
   said first circuit means enabling said second circuit means upon detection of a voltage at said ground connector more negative than the voltage at said neutral connector indicative of the correct operation of said three wire outlet;
   the improvements wherein said first circuit means includes a first transistor switch having the base thereof connected to said ground connector by a resistor having a value of several megohms, the resistance of said first circuit means being not less than the value of said resistor.

2. A ground sensing indicator as defined in claim 1 wherein said first transistor switch is biased OFF when the voltage at said neutral connector is more negative than the voltage at said Ground connector and biased ON when the voltage at said ground connector is more negative than the voltage at said neutral connector.

3. A ground sensing indicator as defined in claim 2, wherein said second circuit means includes a second transistor switch biased ON only for such time as said first transistor is biased ON.

* * * * *